(12) United States Patent
Cooper et al.

(10) Patent No.: US 9,350,184 B2
(45) Date of Patent: May 24, 2016

(54) METHOD AND APPARATUS FOR DISPLAYING BATTERY STATUS

(71) Applicant: THOMSON LICENSING, Issy de Moulineaux (FR)

(72) Inventors: Steven Lee Cooper, Whitestown, IN (US); James Harris Alred, Indianapolis, IN (US)

(73) Assignee: Thomson Licensing, Issy les Moulineaux (FR)

( * ) Notice: Subject to any disclaimer, the term of this patent is extended or adjusted under 35 U.S.C. 154(b) by 726 days.

(21) Appl. No.: 13/705,699

(22) Filed: Dec. 5, 2012

(65) Prior Publication Data
US 2013/0335029 A1     Dec. 19, 2013

Related U.S. Application Data

(60) Provisional application No. 61/651,124, filed on May 24, 2012.

(51) Int. Cl.
| | |
|---|---|
| *H02J 7/00* | (2006.01) |
| *H02J 7/04* | (2006.01) |
| *H02J 7/16* | (2006.01) |
| *G01R 31/36* | (2006.01) |

(52) U.S. Cl.
CPC ........... *H02J 7/0047* (2013.01); *G01R 31/3689* (2013.01); *H02J 2007/005* (2013.01); *H02J 2007/0049* (2013.01)

(58) Field of Classification Search
CPC ...................................................... H02J 7/0027
USPC ........................................................ 320/132
See application file for complete search history.

(56) References Cited

U.S. PATENT DOCUMENTS 6,232,746 B1    5/2001   Yamanashi
6,932,174 B2 *   8/2005   Hirata et al. ............. 180/65.245

FOREIGN PATENT DOCUMENTS

EP        1344074      3/2006
JP         8106928   * 4/1996  ............ H01M 10/48

* cited by examiner

*Primary Examiner* — Edward Tso
*Assistant Examiner* — Ahmed Omar
(74) *Attorney, Agent, or Firm* — Robert D. Shedd; Vincent E. Duffy; Michael A. Pugel

(57) ABSTRACT

The present disclosure is directed towards an adjusted display interface method and apparatus for displaying the charge condition of a battery in a gateway or similar device. In accordance with implementations of the present principles, a mapping is created between the actual battery charge percentage and a desired battery display condition that includes several conditional display levels configured to avoid user confusion.

42 Claims, 4 Drawing Sheets

METHOD AND APPARATUS FOR DISPLAYING BATTERY STATUS

CROSS REFERENCE TO RELATED APPLICATIONS

This application claims priority from and the benefit of U.S. Provisional Application Ser. No. 61/651,124 filed May, 24, 2012, and entitled "Method and Apparatus for Displaying Battery Status", which is incorporated by reference herein in its entirety.

TECHNICAL FIELD

The present disclosure relates to battery status indicators. More particularly, it relates to a display interface for a charging condition of a battery used as the backup battery in a gateway or similar device.

BACKGROUND

Home communication devices, such as gateways, modems, settop boxes and phone devices, often include a backup battery in order to operate under a backup power source when the main power source is interrupted (e.g., electric utility power outage). The backup battery in these devices may be rechargeable, and the devices may include a charging system for maintaining the condition of the backup battery. However, there are a number of conditions associated with maintaining the performance (i.e., full charge level) of the battery. For instance, in order to extend battery life, the battery is never fully charged because too much heat will be generated and battery lifetime may be shortened. As a result, the battery is only charged to, and maintained at, between 70% and 90% of full capacity.

However, a readout showing the actual battery charge condition may be confusing to the user if the battery is shown at 70%, even if it is not being further charged or showing 90% when the battery is fully charged. Cell phone batteries may operate under similar principles. However, cell phone batteries represent the primary source of power and are more likely to be continually charged and discharged rather than operating as a backup system. The cell phone also does not self charge. The cell phone typically requires a user to plug in to a charger. Further, unlike the cell phone battery charging process, the backup battery in a home communications device may be recharged under a variety of conditions in order to most optimally maintain best performance for providing a specified time period of backup operational phone service (e.g., up to eight hours of service). As a result, simple scaling of the battery condition for the user display is not practical and does not address potential user confusion issues regarding battery charge levels. The present invention tries to provide a sensible translation of the charging conditions used in the product with the charging condition readout to the user.

SUMMARY

According to an implementation, a method for displaying battery status includes determining a charge percentage of a battery. An output for display is provided that indicates a maximum charge percentage for the battery if the charge percentage is determined to be above a first percentage of maximum battery charge for the battery. It is then determined whether the battery is at least one of being charged and currently in use when the charge percentage is below the first percentage. When the charge percentage is below the first percentage, a battery percentage output for display is provided that indicates a ratio of an actual charge percentage of the battery and the maximum charge percentage of the battery.

According to another implementation, an apparatus for providing a status display of a backup battery includes a battery, a battery charging circuit, and a controller in communication with the battery charging circuit. The controller is configured to determine a charge percentage of the backup battery, provide a backup battery charge indicator output for display that comprises a maximum charge percentage for the battery if the determined charge percentage is greater than or equal a first percentage of maximum battery charge for the battery, determine whether the battery is at least one of being charged and currently in use if the determined charge percentage is less than the first percentage, and provide a backup battery charge indicator output for display indicating a ratio of the actual percentage of charge of the battery and the maximum charge percentage for the battery if the battery is at least one of being charged and currently in use.

BRIEF DESCRIPTION OF THE DRAWINGS

These and other aspects, features and advantages of the present disclosure will be described or become apparent from the following detailed description of the preferred embodiments, which is to be read in connection with the accompanying drawings.

Figure 1:
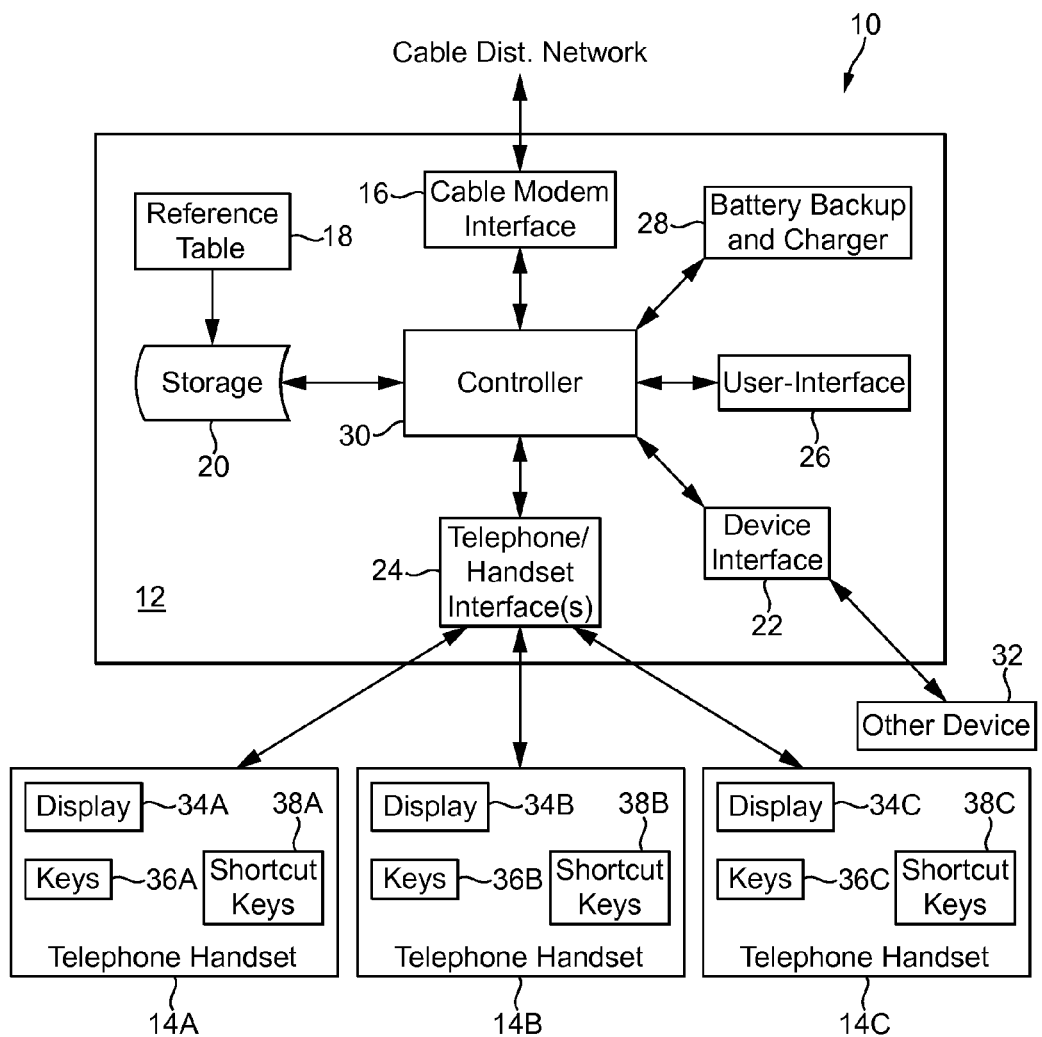
FIG. 1 is a block diagram of a system that includes a backup battery and charging system according to an implementation of the present principles.

It should be understood that the drawing(s) are for purposes of illustrating the concepts of the disclosure and does not necessarily represent the only possible configuration(s) for illustrating the disclosure.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces. Herein, the phrase "coupled" is defined to mean directly connected to or indirectly connected with through one or more intermediate components. Such intermediate components may include both hardware and software based components.

The present description illustrates the principles of the present disclosure. It will thus be appreciated that those skilled in the art will be able to devise various arrangements that, although not explicitly described or shown herein, embody the principles of the disclosure and are included within its scope.

All examples and conditional language recited herein are intended for educational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor or controller, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, read only memory (ROM) for storing software, random access memory (RAM), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The disclosure as defined by such claims resides in the fact that the functionalities provided by the various recited means are combined and brought together in the manner which the claims call for. It is thus regarded that any means that can provide those functionalities are equivalent to those shown herein.

The disclosed embodiments relate to systems that include a backup battery and charging system.

The present principles are directed at an adjusted display interface for the charging condition of the battery used as the backup battery in a gateway or similar device. Gateways and similar devices will often include backup batteries that are used to maintain certain operations of the device (such as phone services) in the case of a main power outage. These batteries are typically maintained at or near full charge capacity at all times when the backup condition is not engaged. However, actual battery charging state may vary over time and charging conditions may be adjusted to try to maintain both battery operating condition and battery lifetime. Displaying the actual battery charge state to the user may create confusion since the user is both unaware of why the battery condition may be changing and may become unnecessarily concerned about the battery charging state if it is changing. The solution, in accordance with implementations of the present principles, is to create a mapping between the actual battery charging state and the desired battery display condition that includes several conditional display levels that will avoid user confusion.

The present disclosure describes a method and apparatus for displaying battery status, including battery charging condition. More specifically, the embodiments relate to a convenient user interface that scales the operation of the battery backup charging and maintenance mechanisms operating in a device to provide a convenient user display that provides minimal user confusion. The present embodiments are primarily focused on a system operating with a backup battery supplying backup power to a device. However, many of the principles described below may equally apply to other battery operated or portable devices.

FIG. 1 shows an embodiment of a system 10 that includes a backup battery and charging system according to aspects of the present disclosure. FIG. 1 includes an advanced cable gateway device 12 interfaced to a cable signal distribution network outside a home, or user premises, and to devices, such as telephone handsets 14A-14C, present inside the home. The cable gateway device 12 generally operates as a data cable modem as well as a voice over internet protocol (VoIP) interface for home telephony.

The main device 12 in FIG. 1 includes a cable modem interface 16, reference table 18, storage device 20, external device interface 22, telephone/handset interface 24, user interface 26, and battery backup and charger 28 all interconnected with a central controller 30 as shown. The cable modem interface 16 operates to tune and demodulate a received signal from the cable distribution network or to modulate and transmit an outgoing signal to the cable distribution network. The cable modem interface 16 passes control information and data transport streams to and from the controller 30. The device interface 22 communicates data between the controller 30 and one or more external devices 32. External devices 32 may include, but are not limited to computers, tablets, video displays, and the like. Depending on design selections, some or all of the external devices 32 may be internal. The communications is typically data communications that include one or more of internet information, video, and/or audio. The communication with the external devices 32 may be done through a wired or wireless interface. The user interface 26 may include a mouse, a button keypad, and/or a touch screen and may include video display technology. The user interface 26 provides user control of the device.

The reference table 18 and storage element 20 provides local storage of data including video content (including program guide information), contact lists, device setting, and the like. The telephone/handset interface 24 provides telephony and control information between the controller 30 and one or more external telephone handsets 14A-14C. The communication is typically made over a twisted pair phone line. However, other protocols and media may be used, such as digital enhanced cordless telecommunications (DECT).

Each telephone handset 14A-14C includes traditional phone circuits as well as a display 34A-34C for the user, including phone numbers, dialing information and the like. The telephone handset also includes a keypad with keys 36A-

36C, either as a set of buttons or a touch screen. The telephone handset may also include an additional set of buttons, used as shortcut keys 38A-38C.

The controller 30 in the main device 12 in FIG. 1 provides a main interface, data protocol translation and decoding, and routing function for the various network interfaces connected to the device 12. The controller 30 also manages the storage and retrieval of data and/or control information to and from the reference table 18 and storage element 20. The controller 30 also provides user interface information and processes user inputs communicated through the user interface 22.

The main device 12 in FIG. 1 also includes a backup battery and charging system 28 in communication with controller 30. The battery backup system in the device 12 is provided to maintain phone operation in the event of a normal power interruption. As such, when a power interruption occurs, the device 12, through operations in the controller 30, will cease to operate except is needed to operate as a phone interface 24 to the connected telephone handsets 14A-14C and to permit VoIP service through the cable network. The battery in the backup battery and charging system 28 may be any type of rechargeable battery, including, but not limited, to a nickel cadmium or nickel metal hydride type. The charger may be a standard battery charging circuit and may be controlled by the controller 30. In addition to all of the other functions in the device 12, the controller 30 maintains the battery condition based on a set of management principles. An exemplary set of these management principles based on aspects of the present disclosure is provided below:

1) Full Charge goal is 90%;
2) Battery leakage, even if the phone portion is not in use, may slowly discharge the battery; and
3) Battery charging is commenced based on a sliding scale of (for instance) time from last charging, discharge rate, and charge level. For instance, regardless of time and rate, the battery is charged when it falls to or below 70% capacity. Charging may also start if the battery is at or below 80% for more than two days, or if the discharge rate exceeds a threshold in a 24 hour time period.

Figure 2:
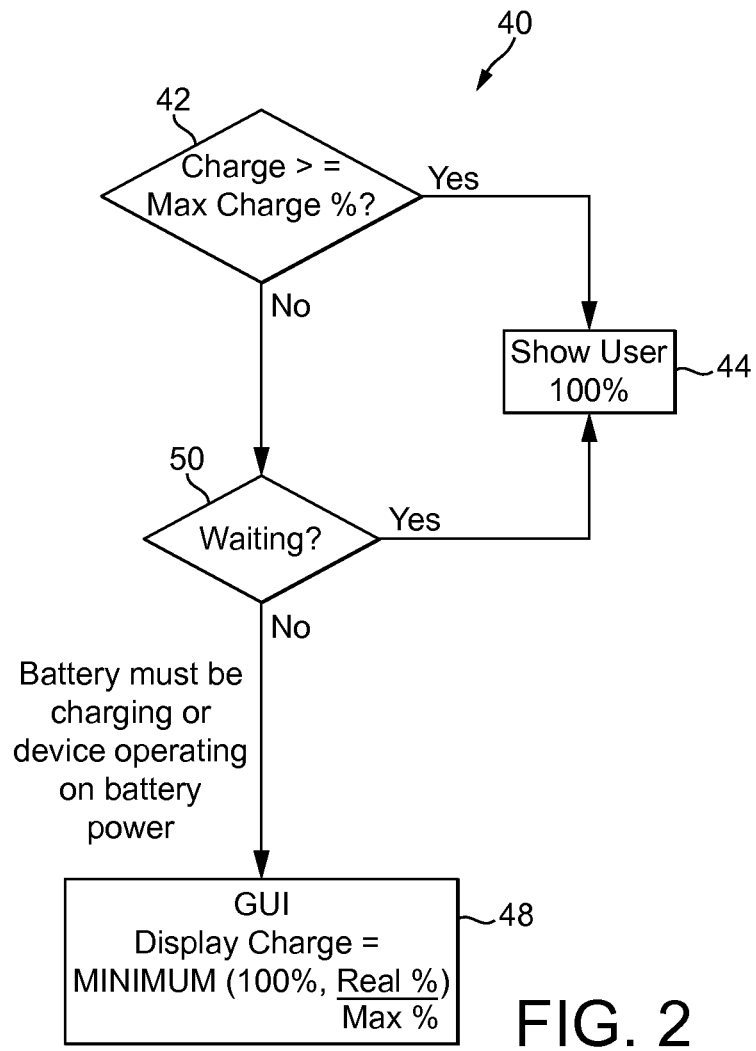
FIG. 2 is flow chart of the method for displaying battery status according to an implementation of the present principles.

FIG. 2 illustrates an exemplary embodiment of a flow chart for operating and maintaining a charging process 40 for a backup battery used in a device, such as the device 12 described in FIG. 1, based on aspects of the present disclosure. The method of FIG. 2 produces or provides a mapping that may be provided to the user as part of a user display representing the backup battery condition. As understood from the above discussion, the backup battery condition displayed to the user is not necessarily the actual current condition for the charge in the battery. The mapping more conveniently displays a condition that will provide minimal user confusion while still providing the expected performance for the battery backup operation.

As shown in FIG. 2, the charge condition (or state) for the battery is monitored, at step 42, either by the charging circuit or by a separate circuit interfaced to the controller. If the charge is greater than or equal to a max charge level representative of a first percentage of a maximum battery charge (e.g., 90%-100%), then the user indication or display, at step 44, shows the battery at 100% level. If the charge condition is less than the max charge level, then a waiting state determination, at step 50, is made. If the battery charge state is "waiting" (i.e., no charging is being performed), the user indicator/display, at step 44, shows the battery indicator at 100%.

If the current or first checked charge state is not waiting, at step 50, this indicates that either the battery is currently charging or the device is currently operating on battery power. In this state, the user is displayed the minimum of a 100% charge indication or a predetermined ratio of the actual and maximum charge percentages. This waiting state check, at step 50, may be used in order to prevent charging the battery too often, such as when only a small drop in charge is identified over a specified period of time. The waiting state check, at step 50, may also be useful given the unusual potential operating conditions, such as may occur during power outages or during intermittent battery operation. If the waiting state check indicates "waiting", then, as noted above, the user indication is displayed, at step 44, as 100% level (i.e., there has been no determination that any significant enough drop in battery charge which necessitates a showing to the user of a change in charge percentage). If the charge state is not waiting, then the charge percentage is provided (displayed), at step 48, as the minimum of 100% or as a ratio of the real charge (%) vs. the max charge (%). In instances where the charging circuitry charges the battery beyond the desired percentage (e.g., 90%), and the real or actual percentage is greater than the max percentage, the display could show greater than 100% (i.e., real/max>1), in which case the display will simply show 100%. Those of skill in the art will appreciate that a similar algorithm may be used to monitor a minimum charge state of the battery (as opposed to the maximum) and provide a seamless display to the user of the recharging condition during the battery recharging.

The above implementation does not take into account the minimum unadjusted charge. There is a non-zero minimum battery charge which will allow the device to run safely. Below that level, the current and voltage will be too low. Before that occurs, the device is shut down at a certain unadjusted charge percentage (e.g., 40%-60%). This is the minimum unadjusted charge percentage (MinUCP). As an improvement, this minimum should be taken into account and the displayed charge percentage adjusted based on the following calculation: (UCP−MinUCP)/(MaxUCP−MinUCP).

Figure 3:
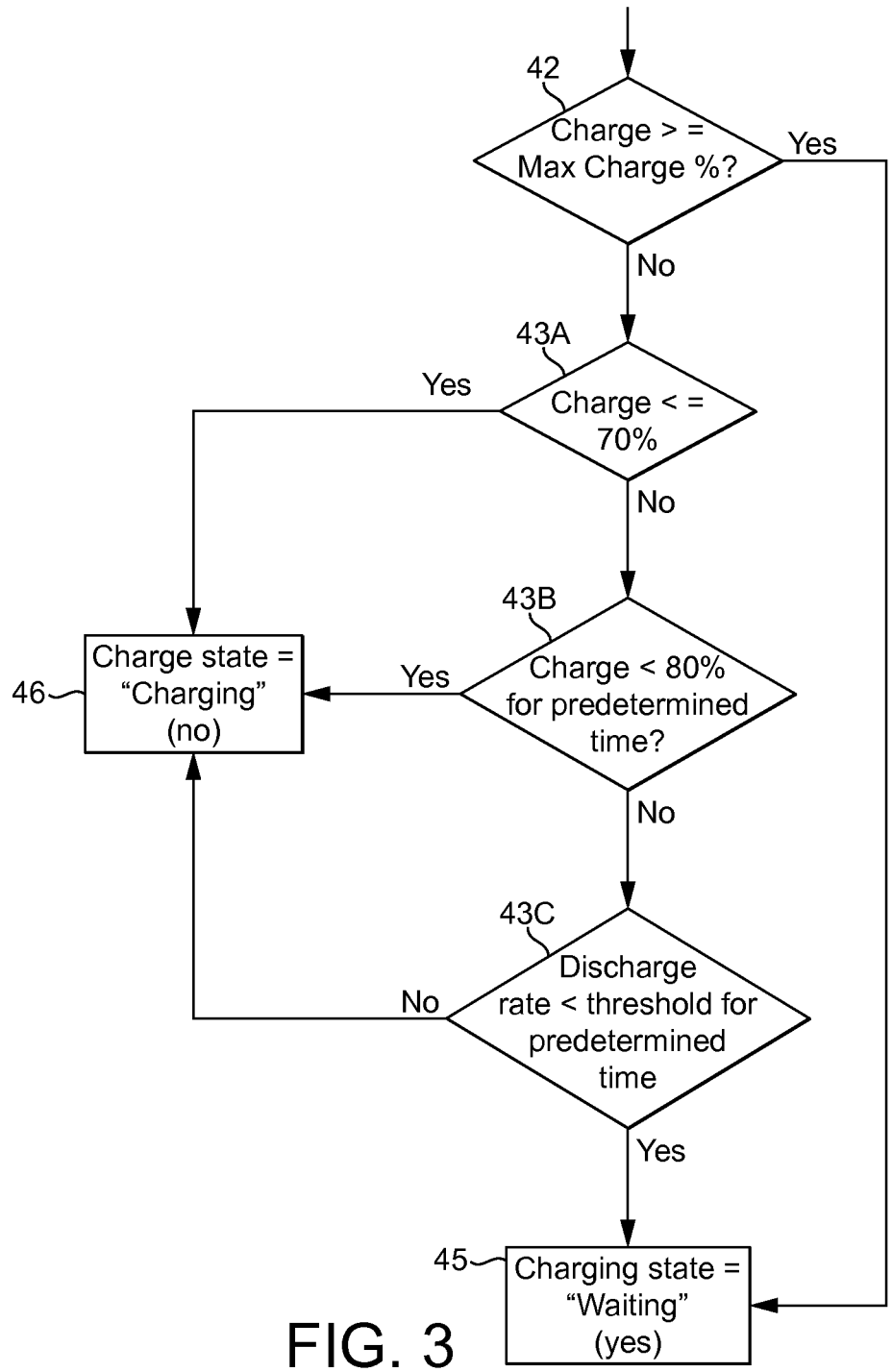
FIG. 3 is a flow chart of alternative implementations for the monitoring of the battery charge state/condition according to the present principles.

FIG. 3 shows an exemplary flow chart for alternative charging state determinations, made at the waiting step 50, of the flowchart of FIG. 2 when the battery charge percentage determination, at step 42, is not greater than or equal to the max charge %. Here, there are multiple possibilities, shown as steps 43A, 43B, and 43C that may occur and are described in combination. However, those of skill in the art will appreciate that one or more of these possibilities may be implemented without departing from the intended scope of the present principles. When the charge is less than the max charge percentage (e.g., 90%), a determination, at step 43A, can be made as to whether the charge percentage is less than or equal to, for example, 70%, if so, the battery is set to charge and the charging state (see "no" output from waiting decision 50 of FIG. 2) is displayed as "charging". If the charge percentage is not equal to or less than 70%, another determination can be made, at step 43B, for example, as to whether the charge percentage has been less than 80% for a predetermined period of time. For example, if the charge percentage has been less than 80% for more than two days, the system can automatically set the battery to charge and the charging state as indicated again displayed as "charging". Alternatively, another determination can be made, at step 43C where the discharge rate of the battery is identified over a predetermined period of time (e.g., 1, 2, 3 days, etc.). If the battery discharge rate is less than some threshold for the predetermined period of time (e.g., only 2% over the course of a 2-day waiting period), the system will remain in the "waiting" state and the charging state, at step 45, will be indicated or displayed to the user as part of step 44 in FIG. 2 as "100%."

As noted above, the various alternatives at steps 43A, 43B, and 43C can be used independent of one another or together in any combination, or as shown. In any case, a negative result from any decision at steps 43A, 43B, and 43C would result in the charging state, at step 45, indicated as "waiting" which would result in a "yes" determination at step 50 in FIG. 2 and would finally result in a display, at step 44, of the 100% charge percentage indicator to the user.

With respect to the discharge rate determination, those of skill in the art will appreciated that as batteries age, they discharge faster, and extra charging cycles wears out batteries. As such, in the above mentioned implementation, we can look at the discharge rate and make adjustments to the waiting period. Using the above example, if the discharge rate is slow (e.g., 2% over the course of a 2-day waiting period, the waiting period can be extended another 2 days to reduce the number of charging cycles and increase battery life.

As will be appreciated, by increasing the maximum charge percentage, this results in a longer operational time, while on battery. For example, each charge percentage might translate to an additional 10 minutes of operational time, while on battery. Thus, a 90% charge would yield 50 additional minutes of operational time compared to an 85% charge.

However, increasing the maximum charge percentage will decrease the operational lifetime of a given battery. For example, a maximum charge of 85% could translate into 27 months of operational life for the average battery, while 90% might result in only 24 months. This decrease in battery lifetime is non-linear, especially as the maximum charge approaches 100%. For the previous example there was of a loss of 3 months for an additional 5% maximum charge percentage above the 85% value. But increasing the maximum charge percentage an additional 5%, to 90%, could potentially result in a 6 or 12 month decrease in battery life. This is the results of increasing resistances inherent in the battery as the charge approaches its maximum value. As those resistances increase, the amount of heat generated also increase, resulting in increased damage to the battery.

Based upon current product battery designs, 90% is the maximum charge percentage that would yield approximately 24 month battery life for the batteries used in a particular cable modem. As an example, a cable modem with VoIP service may require 8 hours of operation while on battery, due to the need to make emergency calls. Given the power required to maintain the minimum operational state for the required timeframe, it might be necessary to set the maximum charge percentage to 90%. This means that the average customer will need a replacement battery after two years. If it is possible to exceed the desired operational time on battery, it may be possible to reduce the maximum charge percentage, i.e., 80-85% to achieve a longer battery lifetime. Note that one possible solution would be to increase the size of the battery, which would allow for reducing the max charge percentage, thereby increasing the battery life. But that will result in a higher initial product cost. As a result, an analysis may be done as known by those skilled in the art to compare the alternatives during product design to determine the maximum long-term profit for the product. As another example, electric vehicles, which have very expensive batteries, require a long battery life such as 10 years, and may require that the maximum charge percentage be much lower, such as 40-50%.

The backup battery condition status information, based on the flow charts presented in FIGS. 2 and 3, may be shown in a graphical user interface (GUI), such as a user interface on the device itself. The backup battery condition status information may also be provided to external devices through the external device interface 22, or even to the telephone handsets 14 themselves (FIG. 1). The battery condition status may also be provided over the cable modem interface (16) and provided to a web-based user interface screen.

Figure 4:
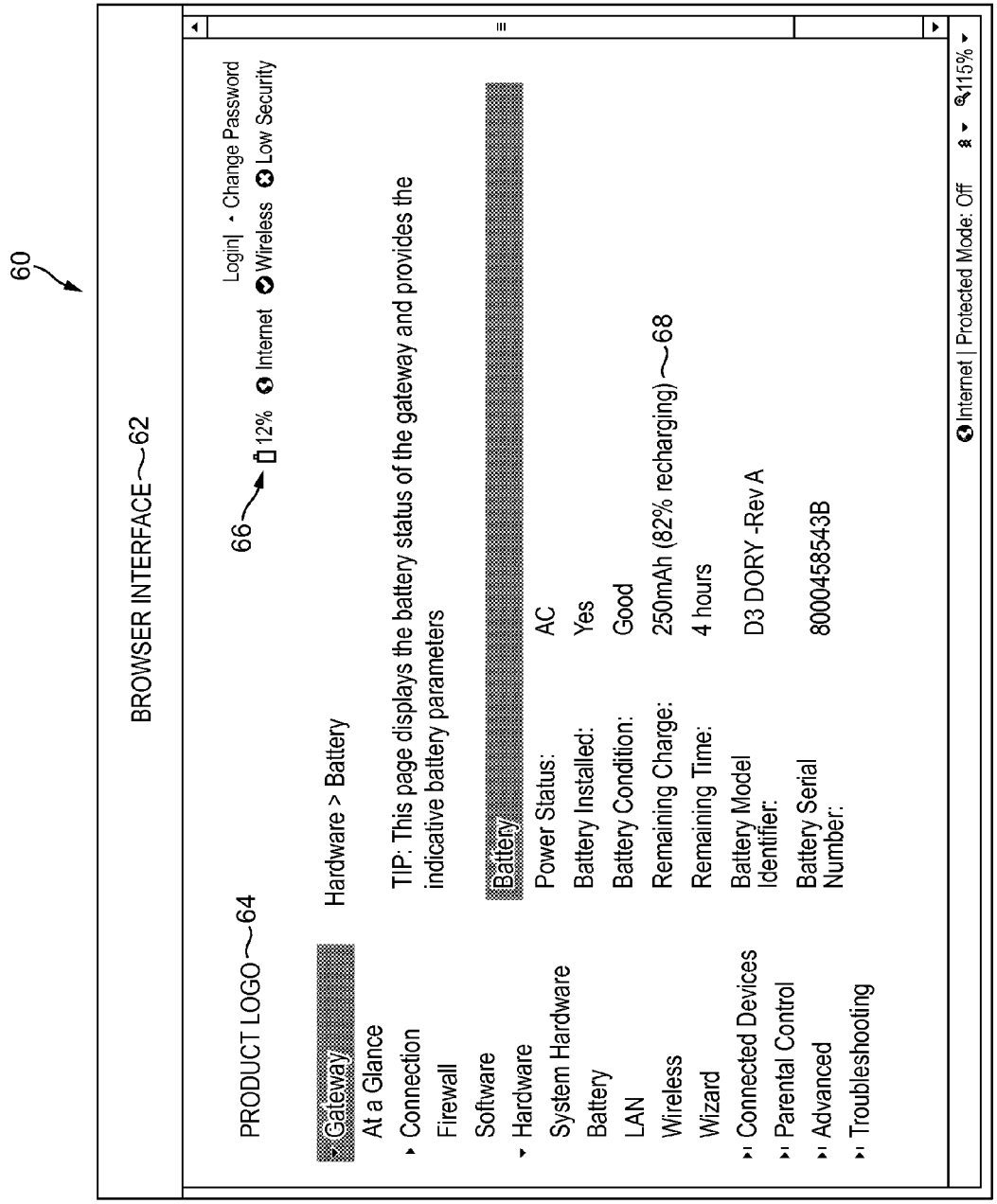
FIG. 4 is an exemplary representation of a Graphical User Interface (GUI) showing the backup battery status in accordance with the method and apparatus of the present principles.

FIG. 4 illustrates a typical battery condition screen graphical user interface (GUI) 60 used in a web-based user interface for a device, such as the device described in FIG. 1. The GUI 60 can have a browser interface 62, an area for a provider logo 64, and various other fields which can be used to display other desired features. The battery condition screen may also be representative of a user interface screen provided to a display, without the web browser portion shown. The battery status condition may be shown as a bar graph in a battery indicator 66 or may be shown in a text readout 68 on a battery status page.

In an alternate embodiment, the method and apparatus described may also indicate a further scaling of the condition of the battery displayed to the user based on the recent battery state and the occurrence of some condition causing the device to reset, or be powered off and back on.

As explained above, if the battery was recently in an idle state (not charging, but only leakage discharging at less than fully charged condition) and a power interruption event occurs for a brief period of time, then the device will reset and would likely begin charging the battery. At this point, the charge level displayed to the user will have changed from an indication of fully charged (100%) to a level that is lower than fully charged as a result of the scaled value that is computed during the charging cycle. In order to prevent the potential confusion, the process may include a "charging" indicator with no charge level shown for a period of time, or may show a further scaled value based on the previous charge condition and the expected final charge condition.

In accordance with another implementation, when a user opens the GUI 60, a determination is made as to whether the displayed charge percentage is being scaled. If so, then the method of the present disclosure stores off the unadjusted charge percentage, by maintaining a copy of the initial unadjusted charge percentage value as a variable stored in RAM for the software to read later for comparison.

During the current browsing section, if power is lost, and/or restored, the normal scaling algorithm described above with respect to the embodiment of FIG. 2 is not used (i.e., unadjusted charge %/Max charge %), because this will cause the displayed percentage charge to drop, possibly dramatically. Instead, a modified algorithm is used where the stored unadjusted charge percentage is used in place of the maximum unadjusted charge percentage (i.e., unadjusted charge %/stored unadjusted charge %). In this manner, the charge percentage, for the current browsing session, will remain showing 100%.

If the user closes the session and opens a new one, then the normal scaling algorithm would be used. In accordance with another alternative implementation, the stored value could be used for a predetermined period of time vs. using the browser session as the time indicator.

The advantages of a user interface, such as that described in FIG. 4, using aspect of the disclosed embodiments may become more apparent by way of example. Without the use of the present embodiments, a battery used in the device, even fully charged, may display an actual battery charge condition that it is only 90% charged. The battery, over time, may show a discharged state, even if not in use and may eventually display a battery status condition as only 80% charged. A user may view this condition as an indication that the battery may not be properly functioning as not being able to hold a charge. Further, during charging, the battery status indication may display 100% charge and immediately display 90% charge following the completion of the charging cycle. The user, viewing these changes in condition, may be confused by the values. The user may choose to contact the device manufacturer or service provider to indicate a problem with the battery, even though the operation of the battery and the charging system is normal.

In contrast, aspects of the present invention solve one or more of the problems described here by displaying a more uniform battery status condition by displaying a 100% charge level, even with the actual battery charge condition starting at 90% and decreasing to 80%. Further, during charging the display for the battery status condition may show that the battery is charging or continue to show the battery at 100% charge level. As a result, the user would not view the operating condition for the battery as unusual and would not choose to contact the device manufacturer or service provider to indicate a problem with the battery.

The embodiments above describe a method and apparatus for displaying battery status, including battery charging condition. More specifically, the embodiments relate to a convenient user interface that scales the operation of the battery backup charging and maintenance mechanisms operating in a device to provide a convenient user display that provides minimal user confusion. The present embodiments may be applied to devices requiring certain service, such as phone services, to be maintained during normal power interruption. However, many of the principles described below may equally apply to other battery operated or portable devices.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although embodiments which incorporate the teachings of the present disclosure have been shown and described in detail herein, those skilled in the art can readily devise many other varied embodiments that still incorporate these teachings. Having described preferred embodiments for a method and apparatus for displaying battery status (which are intended to be illustrative and not limiting), it is noted that modifications and variations can be made by persons skilled in the art in light of the above teachings. It is therefore to be understood that changes may be made in the particular embodiments of the disclosure disclosed which are within the scope of the disclosure as outlined by the appended claims.

The invention claimed is:

1. A method comprising:
   determining a charge percentage of a battery;
   providing a first output for display that indicates a maximum charge percentage for the battery if the charge percentage is determined to be above a first percentage of maximum battery charge for the battery;
   determining whether the battery is at least one of being charged and currently in use if the charge percentage is below the first percentage; and
   providing a second output for display that is a ratio of an actual charge percentage of the battery and the maximum charge percentage of the battery if the battery is at least one of being charged and currently in use;
   wherein said determining whether the battery is at, least one of being charged and currently in use further comprises determining whether the battery has a discharge rate that is greater than a threshold.

2. The method of claim 1, wherein said determining whether the battery is at least one of being charged and currently in use further comprises determining whether the battery charge percentage is less than or equal to 70%.

3. The method of claim 1, wherein said determining whether the battery is at least one of being charged and currently in use further comprises determining whether the battery charge percentage is less than 80% for a period of time.

4. The method of claim 1, wherein the discharge rate is greater than the threshold for a period of time.

5. The method of claim 1, further comprising:
   determining if the charge percentage of the battery is below a second percentage of maximum battery charge; and
   commencing a charging cycle for the battery if it is determined that the charge percentage of the battery is below a second percentage of maximum battery charge.

6. The method of claim 1, further comprising providing a third output for display of a charging indicator, wherein said third output for display does not display the charge percentage for a time period after a power interruption event has occurred.

7. The method of claim 6, further comprising providing a fourth output for display that comprises a ratio of the charge percentage that was output for display prior to a power interruption event that has occurred and the charge percentage of the battery after the power interruption event.

8. The method of claim 1, wherein the battery is used to operate a portion of a device during a power interruption.

9. An apparatus for providing a status display of a battery comprising:
   a battery charging circuit coupled to the battery; and
   a controller in communication with the battery charging circuit and being configured to
      determine a charge percentage of the battery,
      provide a first battery charge indicator output for display that comprises a maximum charge percentage for the battery if the determined charge percentage is greater than or equal a first percentage of maximum battery charge for the battery,
      determine whether the battery is at least one of being charged and currently in use if the charge percentage is below the first percentage, and provide a second battery charge indicator output for display that is a ratio of an actual charge percentage of the battery and the maximum charge percentage of the battery if the battery is at least one of being charged and currently in use, wherein when said controller makes said determination as to whether the battery is being charged, the controller is further configured to determine whether the battery has a discharge rate that is greater than a threshold.

10. The apparatus according to claim 9, wherein when said controller makes said determination as to whether the battery is being charged, the controller is further configured to determine whether the battery charge percentage is less than or equal to 70%.

11. The apparatus according to claim 9, wherein when said controller makes said determination as to whether the battery is being charged, the controller is further configured to determine whether the battery charge percentage is less than 80% for a period of time.

12. The apparatus according to claim 9, wherein the discharge rate is greater than the threshold for a period of time.

13. The apparatus according to claim 9, wherein the controller is further configured to commence a charging cycle for the battery if it is determined that the charge percentage of the battery is below a second percentage of maximum battery charge.

14. The apparatus according to claim 9, wherein the controller is further configured to provide an output for display of a charging indicator, wherein said output for display does not display the charge percentage for a time period after a power interruption event has occurred.

15. The apparatus according to claim 14, wherein the controller is further configured to provide a third battery charge indicator output for display that comprises a ratio of the charge percentage that was output for display prior to a power interruption event that has occurred and the charge percentage of the battery after the power interruption event.

16. The apparatus according to claim 9, wherein the apparatus further includes a telephone circuit and the battery is used to operate the telephone circuit during a power interruption.

17. An apparatus for displaying a battery status comprising:
means for determining a charge percentage of the battery;
means for providing an output for display that indicates a maximum charge percentage for the battery if the charge percentage is determined to be above a first percentage of maximum battery charge for the battery;
means for determining whether the battery is at least one of being charged and currently in use if the charge percentage is below the first percentage; and
means for providing a second output for display that is a ratio of an actual charge percentage of the battery and the maximum charge percentage of the battery if the battery is at least one of being charged and currently in use,
wherein said means for determining whether the battery is at least one of being charged and currently in use further comprises means for determining whether the battery has a discharge rate that is greater than a threshold.

18. The apparatus according to claim 17, wherein said means for determining whether the battery is at least one of being charged and currently in use further comprises means for determining whether the battery charge percentage is less than or equal to 70%.

19. The apparatus according to claim 17, wherein said means for determining whether the battery is at least one of being charged and currently in use further comprises means for determining whether the battery charge percentage is less than 80% for a period of time.

20. The apparatus according to claim 17, wherein the discharge rate is greater than the threshold for a period of time.

21. The apparatus according to claim 17, further comprising:
means for determining if the charge percentage of the battery is below a second percentage of maximum battery charge; and
means for commencing a charging cycle for the battery if it is determined that the charge percentage of the battery is below a second percentage of maximum battery charge.

22. The apparatus according to claim 17, further comprising means for providing a third output for display of a charging indicator, wherein said third output for display does not display the charge percentage for a time period after a power interruption event has occurred.

23. The apparatus according to claim 22, further comprising means for providing a fourth output for display that comprises a ratio of the charge percentage that was output for display prior to a power interruption event that has occurred and the charge percentage of the battery after the power interruption event.

24. The apparatus according to claim 17, wherein the battery is used to operate a portion of a device during a power interruption.

25. A method comprising:
determining a charge percentage of a battery;
providing a first output for display that indicates a maximum charge percentage for the battery if the charge percentage is determined to be above a first percentage of maximum battery charge for the battery;
determining whether the battery is at least one of being charged and currently in use if the charge percentage is below the first percentage;
providing a second output for display that is a ratio of an actual charge percentage of the battery and the maximum charge percentage of the battery if the battery is at least one of being charged and currently in use; and
providing a third output for display of a charging indicator, wherein said third output for display does not display the charge percentage for a time period after a power interruption event has occurred.

26. The method of claim 25, wherein said determining whether the battery is at least one of being charged and currently in use further comprises determining whether the battery charge percentage is less than or equal to 70%.

27. The method of claim 25, wherein said determining whether the battery is at least one of being charged and currently in use further comprises determining whether the battery charge percentage is less than 80% for a period of time.

28. The method of claim 25, further comprising:
determining if the charge percentage of the battery is below a second percentage of maximum battery charge; and
commencing a charging cycle for the battery if it is determined that the charge percentage of the battery is below a second percentage of maximum battery charge.

29. The method of claim 25, further comprising providing a fourth output for display that comprises a ratio of the charge percentage that was output for display prior to a power interruption event that has occurred and the charge percentage of the battery after the power interruption event.

30. The method of claim 25, wherein the battery is used to operate a portion of a device during a power interruption.

31. An apparatus for providing a status display of a battery comprising:

a battery charging circuit coupled to the battery; and a controller in communication with the battery charging circuit and being configured to determine a charge percentage of the battery, provide a first battery charge indicator output for display that comprises a maximum charge percentage for the battery if the determined charge percentage is greater than or equal a first percentage of maximum battery charge for the battery, determine whether the battery is at least one of being charged and currently in use if the charge percentage is below the first percentage, and provide a second battery charge indicator output for display that is a ratio of an actual charge percentage of the battery and the maximum charge percentage of the battery if the battery is at least one of being charged and currently in use, wherein the controller is further configured to provide an output for display of a charging indicator, wherein said output for display does not display the charge percentage for a time period after a power interruption event has occurred.

32. The apparatus according to claim 31, wherein when said controller makes said determination as to whether the battery is being charged, the controller is further configured to determine whether the battery charge percentage is less than or equal to 70%.

33. The apparatus according to claim 31, wherein when said controller makes said determination as to whether the battery is being charged, the controller is further configured to determine whether the battery charge percentage is less than 80% for a period of time.

34. The apparatus according to claim 31, wherein the controller is further configured to commence a charging cycle for the battery if it is determined that the charge percentage of the battery is below a second percentage of maximum battery charge.

35. The apparatus according to claim 31, wherein the controller is further configured to provide a third battery charge indicator output for display that comprises a ratio of the charge percentage that was output for display prior to a power interruption event that has occurred and the charge percentage of the battery after the power interruption event.

36. The apparatus according to claim 31, wherein the apparatus further includes a telephone circuit and the battery is used to operate the telephone circuit during a power interruption.

37. An apparatus for displaying a battery status comprising:

means for determining a charge percentage of the battery;

means for providing an output for display that indicates a maximum charge percentage for the battery if the charge percentage is determined to be above a first percentage of maximum battery charge for the battery;

means for determining whether the battery is at least one of being charged and currently in use if the charge percentage is below the first percentage;

means for providing a second output for display that is a ratio of an actual charge percentage of the battery and the maximum charge percentage of the battery if the battery is at least one of being charged and currently in use; and means for providing a third output for display of a charging indicator, wherein said third output for display does not display the charge percentage for a time period after a power interruption event has occurred.

38. The apparatus according to claim 37, wherein said means for determining whether the battery is at least one of being charged and currently in use further comprises means for determining whether the battery charge percentage is less than or equal to 70%.

39. The apparatus according to claim 37, wherein said means for determining whether the battery is at least one of being charged and currently in use further comprises means for determining whether the battery charge percentage is less than 80% for a period of time.

40. The apparatus according to claim 37, further comprising:

means for determining if the charge percentage of the battery is below a second percentage of maximum battery charge; and means for commencing a charging cycle for the battery if it is determined that the charge percentage of the battery is below a second percentage of maximum battery charge.

41. The apparatus according to claim 37, further comprising means for providing a fourth output for display that comprises a ratio of the charge percentage that was output for display prior to a power interruption event that has occurred and the charge percentage of the battery after the power interruption event.

42. The apparatus according to claim 37, wherein the battery is used to operate a portion of a device during a power interruption.

\* \* \* \* \*